United States Patent
Stegmaier et al.

(10) Patent No.: US 11,848,167 B2
(45) Date of Patent: Dec. 19, 2023

(54) CONTACTOR MODULE AND A CONTACTOR MODULE ARRANGEMENT

(71) Applicant: ABB Schweiz AG, Baden (CH)

(72) Inventors: Peter Stegmaier, Mannheim (DE); Markus Klein, Brühl (DE); Peter Mueller, Dossenheim (DE); Ingo Baetz, Neustadt an der Weinstraße (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/550,153

(22) Filed: Dec. 14, 2021

(65) Prior Publication Data

US 2022/0189711 A1 Jun. 16, 2022

(30) Foreign Application Priority Data

Dec. 14, 2020 (DE) .......................... 202020107235.8

(51) Int. Cl.
*H01H 3/38* (2006.01)
*H01H 3/46* (2006.01)

(52) U.S. Cl.
CPC ................ *H01H 3/38* (2013.01); *H01H 3/46* (2013.01)

(58) Field of Classification Search
CPC ............ H01H 3/38; H01H 3/46; H01H 71/04; H01H 1/0015; G05B 23/02; H02H 7/22; H02B 1/46; H02B 15/00; H02B 13/00; G01L 1/08
USPC ........................................................ 200/329
See application file for complete search history.

(56) References Cited

U.S. PATENT DOCUMENTS

| 2010/0060287 A1* | 3/2010 | Keil ....................... H01H 50/08 |
| | | 324/418 |
| 2016/0370237 A1* | 12/2016 | Zhu ........................ G01B 11/14 |
| 2017/0254852 A1 | 9/2017 | Gould et al. |
| 2021/0358710 A1* | 11/2021 | Hoffmann ............ H01H 1/0015 |

FOREIGN PATENT DOCUMENTS

| CN | 108538659 A | 9/2018 |
| CN | 208142053 U | 11/2018 |
| CN | 110993396 A | 4/2020 |
| DE | 102009041543 A1 | 3/2011 |
| DE | 102016204369 A1 | 9/2017 |
| EP | 0923185 B1 | 6/1999 |
| EP | 3863172 A1 | 8/2021 |
| WO | 2008/087074 A2 | 7/2008 |
| WO | 2010/031414 A1 | 3/2010 |
| WO | 2011/023458 A1 | 3/2011 |
| WO | 2011/023463 A1 | 3/2011 |
| WO | 2018/108833 A1 | 6/2018 |
| WO | 2020/069584 A1 | 4/2020 |

OTHER PUBLICATIONS

European Patent Office, Office Action in European Patent Application No. 21208657.3, 6 pp. (Jun. 1, 2023).

* cited by examiner

*Primary Examiner* — Edwin A. Leon
*Assistant Examiner* — Iman Malakooti
(74) *Attorney, Agent, or Firm* — Leydig, Voit & Mayer, Ltd.

(57) ABSTRACT

A contactor module is adapted to detect a switching state of a contactor. The contactor module includes a movable element that is arranged to transmit the movement of a switching element of the contactor to the contactor module; and a deflection lever attached to the movable element. The deflection lever is arranged to indicate the switching state.

20 Claims, 1 Drawing Sheet

CONTACTOR MODULE AND A CONTACTOR MODULE ARRANGEMENT

CROSS-REFERENCE TO PRIOR APPLICATION

Priority is claimed to German Patent Application No. DE 20 2020 107 235.8, filed on Dec. 14, 2020, the entire disclosure of which is hereby incorporated by reference herein.

FIELD

One or more embodiments of the present invention may relate to a contactor module and a contactor module arrangement.

BACKGROUND

In many applications it is important to know the actual switching state of a contactor. Furthermore, contactors react directly to currents or voltages, for example.

SUMMARY

One or more embodiments of the present invention may provide a contactor module adapted to detect a switching state of a contactor. The contactor module may comprise a movable element that is arranged to transmit the movement of a switching element of the contactor to the contactor module; and a deflection lever attached to the movable element. The deflection lever may be arranged to indicate the switching state.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
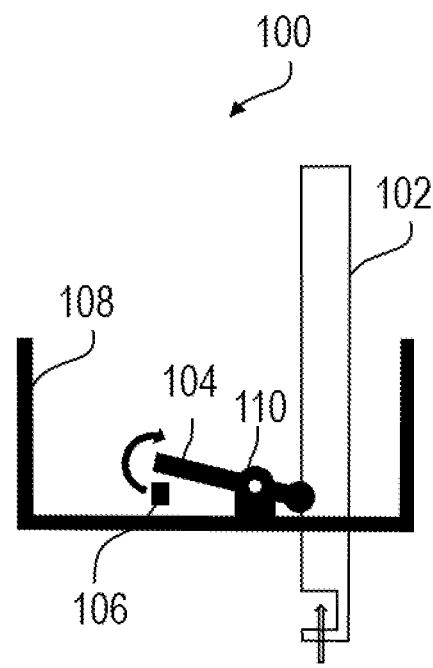
FIG. 1 a schematic drawing of a contactor module according to an embodiment, FIG. 2 a block diagram of a contactor module arrangement according to an embodiment.

In one aspect, the present disclosure describes a device which improves the state detection and control of contactors.

The present disclosure also relates to the subject-matter of the independent claims. Advantageous embodiments are the subject of the dependent claims, the following description, and the figures.

The embodiments described similarly relate to the contactor module and the contactor module arrangement. Synergistic effects may result from various combinations of the embodiments, although they may not be described in detail.

According to a first aspect, there is provided a contactor module arranged to detect a switching state of a contactor. The contactor module comprises a movable element adapted to transmit the movement of the one switching element of the contactor into the contactor module, and a deflection lever attached to the movable element and adapted to indicate the switching state.

The contactor module is a separate module from the contactor that can be docked onto or otherwise associated onto the contactor. In one embodiment, the contactor module is attachable, for example, to the front of the contactor, such as being clipped in or attached by some other mechanical fixture. The contactor comprises a movable element, for example a plunger, based on the movement of which a power circuit is switched or disconnected. This movable element in the contactor is referred to in the present disclosure as a switching element, but other structures may also be used. The contactor may have an opening at its front side, which allows access to the switching element. For example, the switching element has a notch or a recess that can be accessed from the outside, for example by means of another movable element. Thus, the movement of the plunger can be transmitted to the further movable element which is, for example, part of an external module, in this case the contactor module, which can be attached to the contactor. The contactor module can analyze the movement of its movable element and thus detect the switching state of the contactor. For this detection, a deflection lever is provided which contacts the moveable element and is moved thereby or, stated differently, picks up the mechanical movement of the movable element and redirects it into a further movement on the basis of which the switching state of the contactor can then be detected, for example by a sensor. This further movement of the deflection lever is, for example, a rotational movement, which is achieved by a first end of the deflection lever being loosely attached to the movable element, as well as to a fixed axis of rotation in the central part of the deflection lever. Thus, the other, second end of the deflection lever moves in accordance with the geometry corresponding to the end loosely attached to the movable element, which tracks the movement of the movable element. In this regard, the movable element and/or the deflection lever have sufficient clearance or are made of sufficiently flexible material so as to allow or compensate for the circular movement of the first end caused by a rigid axis of rotation. The movement or change in location of the second end may then be detected by, for example, a sensor or switch. The term "indicating the switching state" thus means that the state is mechanically prepared in such a way that it can be detected by a sensor.

According to one embodiment, the movable element is arranged to indicate the switching state optically. Thus, the switching state is visible to and can be read by a user, for example. In this case, a user can, for example, perform an action and operate the contactor.

According to one embodiment, the contactor module further comprises a sensor which is set up to detect the switching state indicated by the deflection lever. The sensor, in particular an optical or light sensor, can be used to implement a light barrier, for example. The signal generated by the sensor or the light barrier can, for example, be passed on to a communication module.

According to one embodiment, the contactor module comprises a communication interface to a sensor module. The sensor module is, for example, an independent module that is set up to transmit data to the contactor module. Via the communication interface, the sensor module can thus transmit, for example, technical and/or physical variables such as a temperature, a voltage, a current or other physical and/or electrical data.

According to one embodiment, the contactor module comprises an electrical communication interface to the contactor. The communication interface can be used, for example, to control the contactor.

According to one embodiment, the contactor module comprises logic arranged to detect the technical and/or physical quantities and to control them via the electrical communication interface to the contactor, taking into account the switching state of the contactor and the values of the technical and/or physical quantities. In other words, the contactor module comprises hardware logic and/or software logic that evaluates the data received from the sensor module and sends signals to the contactor via the electrical communication interface depending on the result of the evaluation. The logic may be implemented, for example, in simple devices such as CPLDs or in an FPGA, processor, DSP or other logic devices known to the skilled person as hardware and/or software.

According to one embodiment, the electrical communication interface is realized by a spring contact. Furthermore, the communication interface is preferably bipolar or multipolar, so that, for example, a common reference voltage, a differential voltage and/or different channels can be realized. In particular, the contactor can be controlled via the bipolar or multipolar contact.

According to one embodiment, the contactor module has further independent electrical interfaces that are set up to enable data exchange with further external devices. Thus, the evaluation logic of the contactor module can also process further inputs and control the contactor accordingly.

According to one embodiment, the movable element of the contactor is positively connected to the movable element of the contactor. This results, for example, in mechanical stability.

According to one embodiment, the contactor module has a display and/or operating elements. The display can, for example, show the switching state of the contactor, the data received from the sensor, and the results of the evaluation. Furthermore, a graphical user interface, a GUI may be implemented. For example, the display may be touch-sensitive and the GUI may have a menu navigation. The GUI could thus be used, for example, to select the data sources to be used for the evaluation, i.e. for the control logic, or to influence the control of the contactor, or to switch between different displays, so that it is possible, for example, to switch between the display of a temperature and a current. The control elements can also be mechanical control elements such as switches, knobs, levers, etc.

The contactor module may further comprise a memory in which, for example, historical values or events may be stored. The memory may be, for example, a ROM such as an EEPROM, a magnetic memory, an optical memory or an electrical memory. Furthermore, threshold values may be stored in the memory, for example, or a configuration may be stored. These values or configuration could be accessed, for example, via the display or controls and the values could be adjusted. Furthermore, the values or the configuration could be changed via a communication interface.

Accordingly, according to a further embodiment, the contactor module comprises a radio interface. This allows the contactor module to communicate wirelessly with the sensor modules or other external modules. Thus, communication with a server or to the cloud is also possible.

According to one embodiment, the contactor module is arranged to exchange data simultaneously with one or more sensor modules and with further contactor modules. This provides a network so that the contactor module can respond to evaluations, states and controls such as control commands from other contactor modules, or the contactor module can send its own corresponding signals and data to the other contactor modules.

According to a further aspect, there is provided a contactor module arrangement comprising a contactor module according to any one of the preceding embodiments, and a sensor module, wherein the sensor module is arranged to send values of technical and/or physical quantities to the contactor module.

According to one embodiment, the contactor module arrangement further comprises a contactor, wherein the contactor is arranged to transmit the mechanical movement of a switching element to the contactor module and to receive control commands from the contactor module via an electrical communication interface. In particular, the contactor comprises a movable element, herein also referred to as a switching element, positively connected to the movable element of the contactor module.

In one method, a switching element of a contactor as defined in the present disclosure transmits the movement to a movable element of a contactor module arranged on the contactor, for example in a form-fitting manner. Furthermore, the movement of the movable element is deflected to a deflection lever, and the position of the deflection lever is detected, for example, by an optical sensor.

According to one aspect, there is provided a program element arranged to control the contactor when executed on a processor or hardware logic. The program element may be part of a computer program, but it may also be an entire program in itself. For example, the computer program element may be used to update an existing computer program to arrive at one or more embodiments of the present invention. The program element may be stored on a computer-readable medium that may be considered a storage medium, such as a USB flash drive, a CD, a DVD, a data storage device, a hard drive, or any other medium on which a program element may reside.

Other variations of the disclosed embodiments may be understood and carried out by those skilled in the art in carrying out the claimed invention by studying the drawings, the disclosure, and the appended claims. In the claims, the word "comprising" does not exclude other elements or steps, and the indefinite article "a" or "one" does not exclude a plurality. A single processor or other entity may perform the functions of multiple items or steps recited in the claims. The mere fact that certain actions are recited in interdependent claims does not mean that a combination of those actions cannot be advantageously used. Reference signs in the claims should not be construed as limiting the scope of the claims.

Corresponding parts are marked with the same reference signs in all figures.

FIG. 1 shows a schematic drawing of a contactor module 100 according to an embodiment. The contactor module 100 has a housing 108 in which a movable element 102 is located. The movable element 102 is slidably disposed in the housing 108 and configured to be positively connected to the movable element at one end (denoted by the arrow on the bottom of FIG. 1), for example a plunger of the contactor. This movable element 102, with the deflection lever 104 connected thereto, is arranged and guided in such a way that a light barrier moves to interrupt a light beam from a light source from teaching a light sensor 106 such as a photoelectric sensor. That is, as the plunger moves via the movable element 102, the first end of the deflection lever 104 disposed opposite the moveable element 102 also moves, and thus, due to the rotational movement about the rotational axis 110 formed at a pivot joint between the deflection lever 104 and the housing 108. The pivot joint 110 or rotation axis 110 is disposed between the moveable element 102 and the light sensor 106 along the housing 108. The second end of the deflection lever thus moves when the moveable element 102 moves, but in an opposite direction, as shown in FIG. 1. In a first end position, the second end is disposed in the path of a light beam such that the light does not strike the sensor 106. In the first end position, the second end thus blocks the light from reaching the light sensor. In a second end position the second end pivots like a fulcrum in the direction of curved arrow in FIG. 1 to swing out of the path of the light beam such that light reaches or strikes the sensor 106. The sensor can thus detect the end position of the deflection lever and thus the switching state of the contactor. Preferably, the movable element 102 is further configured such that the switching position of the contactor is visible on the front of the contactor module 100 and the contactor can be actuated by hand by an operator. Actuation of the contactor by hand causes the movable element 102 to also move, which in turn will also activate the switching element accordingly from a tripped position to an un-tripped position, and vice versa.

Figure 2:
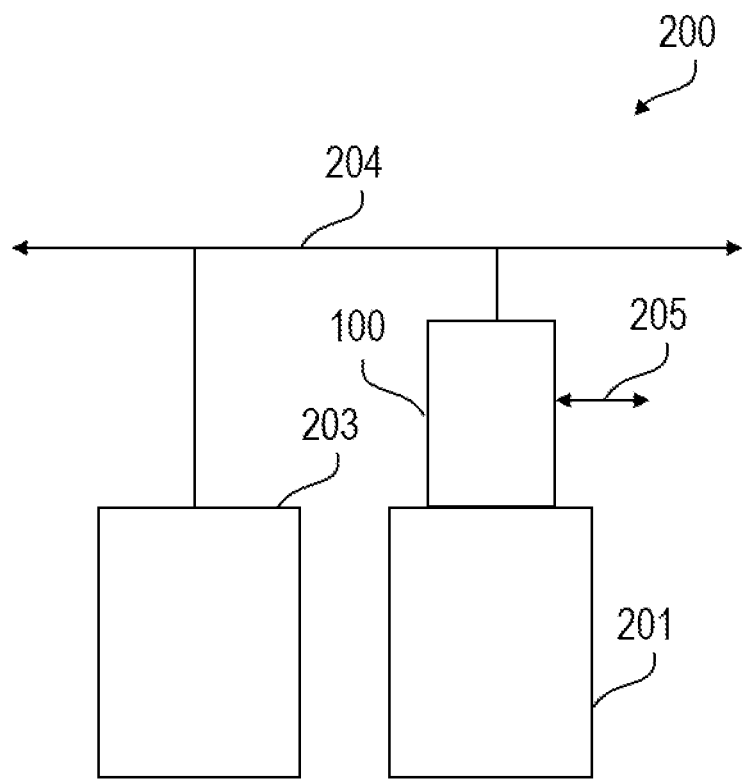

FIG. 2 shows a block diagram of a contactor module arrangement 200 according to an embodiment. The contactor module 100 is electrically and mechanically coupled to the front of a contactor 201, and to a sensor module 203 via a communication interface 204. The electrical coupling is resilient and at least bipolar, allowing the contactor 201 to be controlled.

The sensor module 203 and the contactor module 100 thus have a multipole interface 204 via which the two devices 203, 100 can be electrically connected to each other and exchange data. The devices 203, 100 form a common functional unit in this case.

The contactor module 100 may include other independent electrical interfaces 205 that allow data exchange with external devices other than those described herein. The contactor module 100 may further comprise a display and control elements, as well as a radio interface. The contactor module 100 may, for example, exchange data simultaneously with one or more sensor modules 203 and with other contactor modules 100 via this radio interface.

The sensor module 203 has sensors or circuits for measuring currents and voltages, for example. In another embodiment, the sensor module 203 has sensors for detecting temperatures or other electrical variables.

While one or more embodiments of the disclosure have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A contactor module adapted to detect a switching state of a contactor, the contactor module comprising:
   a movable element that is arranged to transmit the movement of a switching element of the contactor to the contactor module; and
   a first end of a deflection lever attached to the movable element,
   wherein the first end of the deflection lever moves in a first direction based on a movement of the movable element, and
   wherein the deflection lever is arranged to indicate the switching state by deflecting a second end of the deflection lever in a second direction based on a movement of the first end of the deflection lever, wherein the second direction is different from the first direction.

2. The contactor module according to claim 1, wherein the movable element is arranged to optically indicate the switching state.

3. The contactor module according to claim 1, wherein the contactor module further comprises a sensor adapted to detect the switching state indicated by the deflection lever.

4. The contactor module according to claim 3, wherein the sensor is an optical sensor.

5. The contactor module according to claim 1, wherein the contactor module further comprises a communication interface to a sensor module.

6. The contactor module according to claim 5, wherein the contactor module is further adapted to detect technical and/or physical quantities through the communication interface to the sensor module.

7. The contactor module according to claim 6, wherein the technical and/or physical quantities comprise at least one member of a group consisting of a temperature, a voltage, and a current.

8. The contactor module according to claim 1, wherein the contactor module further comprises an electrical communication interface to the contactor.

9. The contactor module according to claim 8, wherein the contactor module further comprises logic that is arranged to detect technical and/or physical quantities and to control the technical and/or physical quantities via the electrical communication interface to the contactor, taking into account the switching state of the contactor and the values of the technical and/or physical quantities.

10. The contactor module according to claim 8, wherein the electrical communication interface is implemented by a spring contact.

11. The contactor module according to claim 1, wherein the contactor module further comprises further independent electrical interfaces arranged to enable data exchange with further external devices.

12. The contactor module according to claim 1, wherein a movable element of the contactor is positively connected to a movable element of the contactor module.

13. The contactor module according to claim 1, wherein the contactor module further comprises a display and/or control elements.

14. The contactor module according to claim 1, wherein the contactor module further comprises a radio interface.

15. The contactor module according to claim 1, wherein the contactor module is arranged to exchange data simultaneously with one or more sensor modules and with further contactor modules.

16. A contactor module arrangement comprising the contactor module according to claim 1 and a sensor module, wherein the sensor module is arranged to send values of technical and/or physical quantities to the contactor module.

17. The contactor module arrangement according to claim 16, further comprising a contactor, wherein the contactor is adapted to transmit the mechanical movement of a switching element to the contactor module and to receive control commands from the contactor module via an electrical communication interface.

18. The contactor module arrangement according to claim 1, wherein the deflection lever is configured for rotational movement.

19. The contactor module arrangement according to claim 18, wherein the rotational movement of the deflection lever is achieved by a first end of the deflection lever coupled to the movable element and to a fixed axis of rotation in a central part of the deflection lever.

20. The contactor module arrangement according to claim 1, wherein the deflection lever is configured to indicate the switching state by deflecting a light beam from a light source away from a light sensor.

* * * * *